(12) United States Patent
Kang (10) Patent No.: US 9,170,484 B2
(45) Date of Patent: Oct. 27, 2015

(54) MASK AND METHOD OF MANUFACTURING THE SAME

(71) Applicant: Samsung Display Co., Ltd., Yongin (KR)

(72) Inventor: Tae Min Kang, Suwon-si (KR)

(73) Assignee: SAMSUNG DISPLAY CO., LTD. (KR)

(*) Notice: Subject to any disclaimer, the term of this patent is extended or adjusted under 35 U.S.C. 154(b) by 160 days.

(21) Appl. No.: 14/023,765

(22) Filed: Sep. 11, 2013

(65) Prior Publication Data

US 2014/0335445 A1    Nov. 13, 2014

(30) Foreign Application Priority Data

May 9, 2013    (KR) .................. 10-2013-0052617

(51) Int. Cl.
  *G03F 1/22* (2012.01)
  *G03F 1/24* (2012.01)
  *G03F 1/68* (2012.01)

(52) U.S. Cl.
  CPC ........................................ *G03F 1/68* (2013.01)

(58) Field of Classification Search
  CPC .................... G03F 1/22; G03F 1/24

USPC ............................................. 430/5, 322, 323
See application file for complete search history.

(56) References Cited

U.S. PATENT DOCUMENTS

2008/0153039 A1* 6/2008 Akimoto ................ 430/313
2011/0151358 A1* 6/2011 Kamo ................ 430/5
2011/0287348 A1* 11/2011 Yoon et al. ................ 430/5

FOREIGN PATENT DOCUMENTS

JP    2001-009583 A    1/2001
JP    2004-128187 A    4/2004

* cited by examiner

*Primary Examiner* — Stephen Rosasco
(74) *Attorney, Agent, or Firm* — Cantor Colburn LLP (57) ABSTRACT

A method of manufacturing a mask includes: providing a base substrate including light-absorbing layer patterns on a first surface thereof; providing a reflective layer on the light-absorbing layer patterns and the first surface of the base substrate; and providing reflective patterns by partially removing the reflective layer. The providing the reflective patterns includes removing the light-absorbing layer patterns and a portion of the reflective layer, by irradiating the light-absorbing layer patterns with laser light.

20 Claims, 8 Drawing Sheets

MASK AND METHOD OF MANUFACTURING THE SAME

This application claims priority to Korean Patent Application No. 10-2013-0052617 filed on May 9, 2013, and all the benefits accruing therefrom under 35 U.S.C. §119, the disclosure of which is incorporated herein by reference in its entirety.

BACKGROUND

1. Field

The invention relates to a mask and a method of manufacturing the same.

2. Description of the Related Art

Flat panel display devices are replacing cathode-ray tube display devices, due to their lightweight and thin characteristics. Typical examples of the flat panel display devices include liquid crystal display devices ("LCDs") and organic light-emitting diode display devices ("OLEDs"). OLEDs have excellent brightness and viewing angle characteristics as compared to LCDs, and can be realized as ultra-thin display devices because they do not require a separate light source such as a backlight unit.

OLEDs use a phenomenon in which electrons and holes injected into an organic thin film from a cathode and an anode are recombined to form excitons, and light having a specific wavelength is emitted by energy generated from the excitons.

OLEDs are classified into a passive-matrix type and an active-matrix type according to a driving method. Active-matrix OLEDs include a circuit using a thin-film transistor ("TFT").

Passive-matrix OLEDs are easy to manufacture because their display region is constructed in a simple matrix of anodes and cathodes. However, the passive-matrix OLEDs are restricted in application fields of low-resolution and small displays due to problems with resolution, an increase in driving voltage and a decrease in material duration. Active-matrix OLEDs can provide stable luminance due to a constant current supplied to each pixel using a TFT located at each pixel of a display region. With their low power consumption, the active-matrix OLEDs can be implemented as high-resolution and relatively large-sized displays.

To realize a full-color OLED, red, green and blue light-emitting layers may be formed using a laser induced thermal imaging ("LITI") method among various methods. In the LITI method, a laser beam emitted from a laser source is patterned using a mask having patterns, and the patterned laser beam is irradiated onto a donor substrate which includes a base substrate, a light-to-heat conversion layer and a transfer layer (e.g., an organic layer including a light-emitting layer), such that part of the transfer layer can be transferred onto a device substrate. Accordingly, organic film layer patterns including the light-emitting layer are formed on the device substrate. The LITI method is advantageous in that it can finely pattern each light-emitting layer and is a dry-etching process.

The mask having the patterns includes transmissive regions which transmit laser light and non-transmissive regions which do not transmit laser light.

SUMMARY

One or more exemplary embodiment of the invention provides a method of manufacturing a mask in a simplified process and with improved process efficiency and a mask manufactured by the method.

One or more exemplary embodiment of the invention also provides a method of manufacturing a large-area mask more easily and a mask manufactured by the method.

However, embodiments of the invention are not restricted to the one set forth herein. The above and other features of the invention will become more apparent to one of ordinary skill in the art to which the invention pertains by referencing the detailed description of the invention given below. According to an exemplary embodiment of the invention, there is provided a method of manufacturing a mask. The method includes: providing a base substrate including light-absorbing layer patterns on a first surface thereof; providing a reflective layer on the light-absorbing layer patterns and the first surface of the base substrate; and providing reflective patterns by partially removing the reflective layer. The providing the reflective patterns includes removing the light-absorbing layer patterns and a portion of the reflective layer, by irradiating the light-absorbing layer patterns with laser light.

According to another exemplary embodiment of the invention, there is provided a method of manufacturing a mask. The method includes: providing a base substrate including light-absorbing layer patterns on a first surface thereof and a reflection preventing layer on a second surface opposite to the first surface thereof; providing a reflective layer on the light-absorbing layer patterns and the first surface of the base substrate; and providing reflective patterns by partially removing the reflective layer. The providing the reflective patterns includes removing the light-absorbing layer patterns and part of the reflective layer, by irradiating the light-absorbing layer patterns with laser light.

According to another exemplary embodiment of the invention, there is provided a mask including: reflective patterns on a first surface of a base substrate; and a reflection preventing layer covering a second surface opposite to the first surface of the base substrate. A side surface of the reflective patterns is uneven.

BRIEF DESCRIPTION OF THE DRAWINGS

The above and other features of the invention will become more apparent by describing in detail exemplary embodiments thereof with reference to the attached drawings, in which.

DETAILED DESCRIPTION

Hereinafter, exemplary embodiments of the invention will be described in detail with reference to the accompanying drawings. The features of the invention and methods for achieving the features will be apparent by referring to the exemplary embodiments to be described in detail with reference to the accompanying drawings. However, the invention is not limited to the exemplary embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

In the entire description of the invention, the same drawing reference numerals are used for the same elements across various figures. In the drawings, sizes and relative sizes of layers and areas may be exaggerated for clarity in explanation.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. As used herein, the term "and/or" includes any and all combinations of one or more of the associated listed items.

Although the terms "first, second, and so forth" are used to describe diverse elements, components and/or sections, such elements, components and/or sections are not limited by the terms. The terms are used only to discriminate an element, component, or section from other elements, components, or sections. Accordingly, in the following description, a first element, first component, or first section may be a second element, second component, or second section.

The terminology used herein is for the purpose of describing particular exemplary embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

In the laser induced thermal imaging ("LITI") method, a laser beam emitted from a laser source is patterned using a mask having patterns. To form the transmissive regions and the non-transmissive regions of the mask, reflective patterns can be used. Generally, the reflective patterns are manufactured by a multistage process, that is, a photolithography process, including forming a light-reflecting layer on a mask substrate, coating photosensitive resin (otherwise referred to as photoresist) on the light-reflecting layer, and performing pattern exposure, development. etching using the resist as a mask, and the removal of the resist.

Therefore, this method of manufacturing a mask requires a multistage process. However, as the number of photolithography processes increases, process efficiency is reduced. In particular, this method is not suitable for manufacturing a large-area mask. Therefore, there remains a need for an improved mask and manufacturing method thereof, which has increased process efficiency and is suitable for large-area mask manufacturing.

Hereinafter, exemplary embodiments of the invention will be described with reference to the attached drawings.

Figure 1:
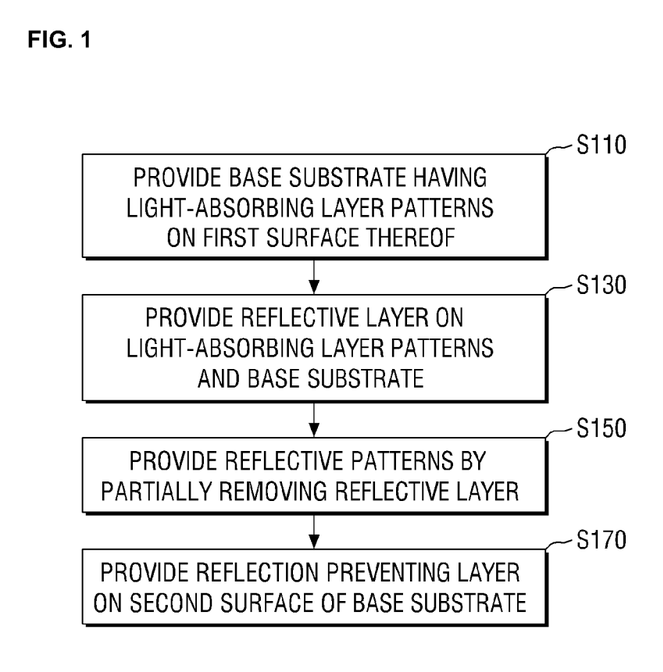
FIG. 1 is a flowchart illustrating an exemplary embodiment of a method of manufacturing a mask according to the invention.

FIG. 1 is a flowchart illustrating an exemplary embodiment of a method of manufacturing a mask according the invention. FIGS. 2 through 7 are cross-sectional views illustrating exemplary embodiments of operations in the manufacturing method of FIG. 1.

Referring to FIG. 1, the method of manufacturing the mask includes providing a base substrate having light-absorbing layer patterns on a first surface thereof (operation S110), forming (e.g., providing) a reflective layer on the light-absorbing layer patterns and the base substrate (operation S130), and providing reflective patterns by partially removing the reflective layer (operation S150). The method may further include providing a reflection preventing layer on a second surface of the base substrate (operation S170).

Referring to FIGS. 1 through 4, the providing of the base substrate having the light-absorbing layer patterns on the first surface thereof (operation S110) may be performed as follows.

Figure 2:
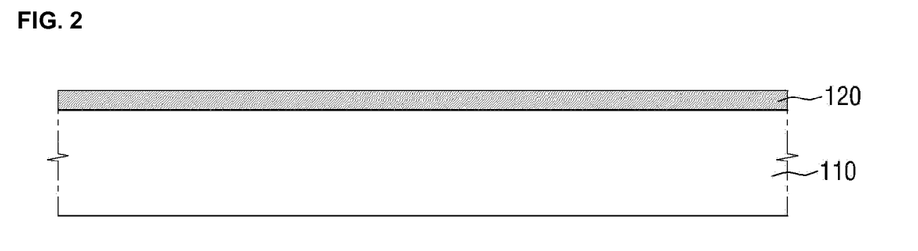
FIGS. 2 through 7 are cross-sectional views illustrating exemplary embodiments of operations in the manufacturing method of FIG. 1.

First, referring to FIG. 2, a light-absorbing material layer 120 is formed on a first surface of a base substrate 110.

The base substrate 110 may include a light-transmitting material that allows light such as laser light to transmit therethrough. However, there is no restriction on the material of the base substrate 110. In one exemplary embodiment, for example, the base substrate 110 may include a glass substrate, a quartz substrate, a sapphire substrate, a ceramic substrate, a semiconductor substrate, etc.

The light-absorbing material layer 120 may include a material that can absorb light such as laser light, such as a conductive material or an insulating material. The conductive material may be, but is not limited to, an element of chrome (Cr), molybdenum (Mo), nickel (Ni), titanium (Ti), cobalt (Co), copper (Cu) or aluminum (Al), an alloy material containing the above element as a main component thereof, a compound (such as a nitrogen compound, an oxygen compound, a carbon compound, or a halogen compound), etc. In one exemplary embodiment, when the conductive material is used, the light-absorbing material layer 120 may be formed by a deposition method, a sputtering method, a chemical vapor deposition ("CVD") method, etc. When the insulating material is used, the light-absorbing material layer 120 may be formed by a coating method.

The light-absorbing material layer 120 may also include a semiconductor material such as silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride or strontium titanate; an organic resin material such as polyimide, acrylic, polyamide, polyimide-amide, resist or benzocyclobutene; or an insulating material such as siloxane or polysilazane.

In FIG. 2, the light-absorbing material layer 120 has a single layer structure. However, a single layer structure is merely an example, and the light-absorbing material layer 120 can also have a multilayer stacked structure.

Figure 3:
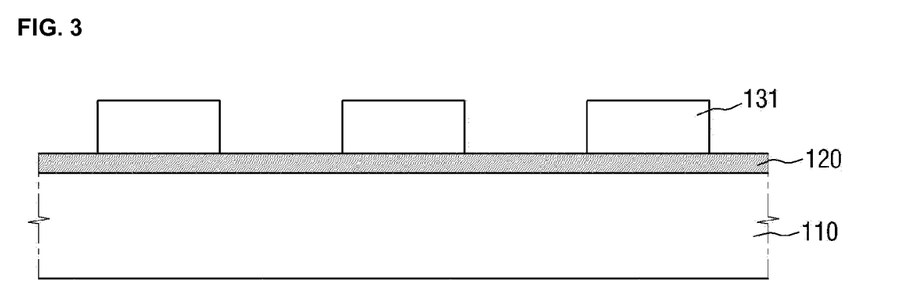

Referring to FIG. 3, photoresist patterns 131 are formed on the light-absorbing material layer 120. The formation of the photoresist patterns 131 may be achieved by a known photolithography process. While a single photoresist pattern is labeled as 131 in the figures, it will be understood that a plurality of photoresist patterns may also be represented by the 131 label.

Figure 4:
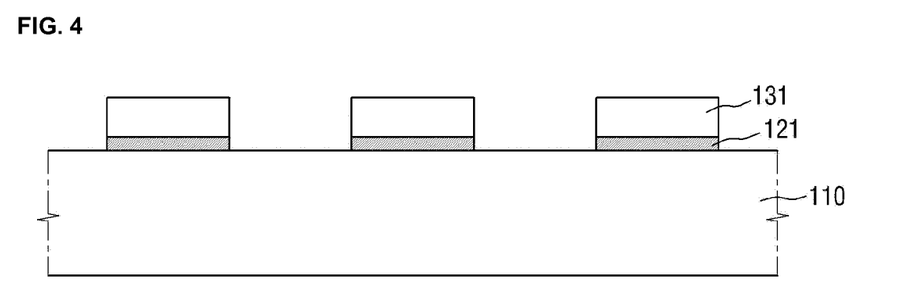

The light-absorbing material layer 120 is patterned using the photoresist patterns 131 as a mask, thereby forming light-absorbing layer patterns 121 as shown in FIG. 4. That is, portions of the light-absorbing material layer 120 which are masked (e.g., overlapped) by the photoresist patterns 131 may become the light-absorbing layer patterns 121, and portions of the light-absorbing material layer 120 which are not masked by the photoresist patterns 131 may be removed. In addition, the first surface of the base substrate 110 may be exposed at areas where portions of the light-absorbing material layer 120 have been removed. While a single light absorbing pattern is labeled as 121 in the figures, it will be understood that a plurality of light absorbing patterns may also be represented by the 121 label.

There is no restriction on the method of patterning the light-absorbing material layer 120. In one exemplary embodiment, for example, dry etching or wet etching can be used.

Although not shown in the drawings, the photoresist patterns 131 may, if necessary, be removed before a subsequent process. Alternatively, the subsequent process may be performed without removing the photoresist patterns 131. In particular, if the subsequent process is performed without removing the photoresist patterns 131, a photoresist stripping process may be omitted, thus reducing the number of processes performed. An exemplary embodiment where the subsequent process is performed without removing the photoresist patterns 131 will be described below as an example, but the invention is not limited thereto.

Figure 5:
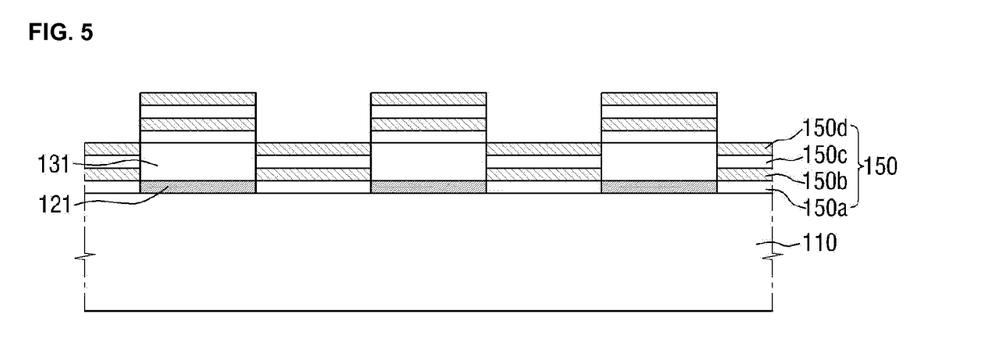

Referring to FIGS. 1 and 5, the providing of the reflective layer on the light-absorbing layer patterns and the base substrate (operation S130) may be performed as follows.

Referring to FIG. 5, a reflective material layer 150 is formed on the first surface of the base substrate 110 having the light-absorbing layer patterns 121 thereon. That is, the reflective material layer 150 is formed on the first surface of the base substrate 110 exposed between the light-absorbing layer patterns 121 and on the photoresist patterns 131. Although not shown in FIG. 5, if the photoresist patterns 131 have been removed as described above, it follows that the reflective material layer 150 can be formed on the first surface of the base substrate 110 exposed between the light-absorbing layer patterns 121 and on the light-absorbing layer patterns 121.

The reflective material layer 150 may include a dielectric. The reflective material layer 150 may include a dielectric material such as any one material or a compound of two or more materials selected from $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, VOX, SiNX, eNX, MN, ZnS, CdS, SiC, SiCN, MgF, $CaF_2$, NaF, $BaF_2$, $PbF_2$, LiF, $LaF_3$, and GaP. However, the material of the reflective material layer 150 is not limited to the above example materials.

The reflective material layer 150 may have a multilayer structure. In an exemplary embodiment, the reflective material layer 150 may include first reflective films 150*a* and 150*c* and second reflective films 150*b* and 150*d* stacked alternately. In FIG. 5, the reflective material layer 150 has a four-layer structure. However, the four-layer structure is merely an example used for ease of description, and there is no restriction on the number of layers included in the reflective material layer 150. In one exemplary embodiment, for example, the reflective material layer 150 can have a structure consisting of 40 or more layers. In FIG. 5, the first reflective film 150*a* is located at the bottom of the reflective material layer 150 as a lowest layer, and the second reflective film 150*d* is located at the top of the reflective material layer 150 as a uppermost layer. However, films of the lowest and uppermost layer shown in FIG. 5 is merely an example, and reflective films located at the bottom and top of the reflective material layer 150 can be changed if necessary.

Any one of the first reflective films 150*a* and 150*c* and the second reflective films 150*b* and 150*d* may include a high dielectric constant (e.g., high-k) material, and the other one of the first reflective films 150*a* and 150*c* and the second reflective films 150*b* and 150*d* may include a low-k material. In one exemplary embodiment, each of the first reflective films 150*a* and 150*c* may include a high-k layer such as $TiO_2$ or $Al_2O_3$, and each of the second reflective films 150*b* and 150*d* may include a low dielectric constant (low-k) layer such as $SiO_2$. That is, the reflective material layer 150 may have a structure in which the low-k layer and the high-k layer are stacked alternately. However, such a stacked structure is merely an example, and the material of the high-k layer and the material of the low-k layer can be selected from the above materials for forming the reflective material layer 150. In addition to the above materials for the reflective material layer 150, any of a number of materials that have been developed and commercialized or are realizable depending on future technological developments can be used as the material that forms the high-k layer and the material that forms the low-k layer.

The first reflective films 150*a* and 150*c* may include the same material, or any one of the first reflective films 150*a* and 150*c* may include a different material than the other. In one exemplary embodiment, for example, if the first reflective films 150*a* and 150*c* include a high-k material, the films may include the same high-k material or different high-k materials. Although not shown in the drawings, if the first reflective films include three or more layers, the layers may include the same material, or any of the layers may include a different material than another layer.

Likewise, the second reflective films 150*b* and 150*d* may include the same material, or any one of the second reflective films 150*b* and 150*d* may include a different material than the other. In one exemplary embodiment, for example, if the second reflective films 150*b* and 150*d* include a high-k material, the films may include the same high-k material or different high-k materials. Although not shown in the drawings, if the second reflective films include three or more layers, the layers may include the same material, or any of the layers may be formed of a different material than another layer.

There is no restriction on the method of forming the reflective material layer 150. The reflective material layer 150 can be formed using any of a number of methods that have been developed and commercialized or are realizable depending on future technological developments, such as a spin coating method, a spray coating method, a screen printing method, an inkjet method, a dispensing method, a sputtering method, a physical vapor deposition ("PVD") method, a CVD method, a plasma-enhanced chemical vapor deposition ("PECVD") method, a thermal evaporation method, a thermal ion beam assisted deposition ("IBAD") method, and an atomic layer deposition ("ALD") method.

Figure 6:
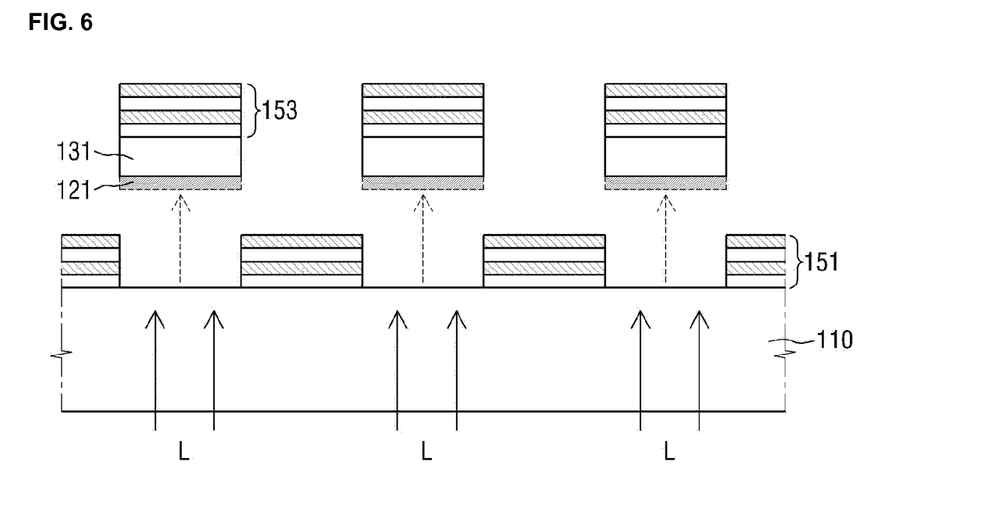

Referring to FIGS. 1 and 6, the forming of the reflective patterns by partially removing the reflective layer (operation S150) may be performed as follows.

Referring to FIG. 6, the light-absorbing layer patterns 121 are irradiated with laser light L. Here, a direction in which the laser light L is irradiated may be a direction from a second surface of the base substrate 110 toward the light-absorbing layer patterns 121. The second surface of the base substrate 110 refers to a surface opposite the first surface of the base substrate 110 on which the light-absorbing layer patterns 121 are located.

There is no restriction on the laser light L as long as the laser light L has energy absorbed by the light-absorbing layer patterns 121. In one exemplary embodiment, for example, the laser light L may be selected from ultraviolet laser light, visible laser light, and infrared laser light. As a laser oscillator capable of oscillating the laser light L, an excimer laser oscillator such as KrF, ArF or XeCl; a gas laser oscillator such as He, He—Cd, Ar, He—Ne or HF; a solid-state laser oscillator using a monocrystal of YAG, $YVO_4$, forsterite ($Mg_2SiO_4$), $YAlO_3$ or $GdVO_4$ or a polycrystal (ceramic) of YAG, $Y_2O_3$, $YVO_4$, $YAlO_3$ or $GdVO_4$ doped with at least one of Nd, Yb, Cr, Ti, Ho, Er, Tm and Ta; or a semiconductor laser oscillator such as GaN, GaAs, GaAlAs or InGaAsP may be used. Further, a fundamental wave or any of second to fifth harmonics may be used in the solid-state laser oscillator.

In addition, a continuous-wave laser beam or a pulsed laser beam may be used as the laser light L. As for the pulsed laser beam, an oscillation frequency of several tens of hertz (Hz) to several kilohertz (kHz) is typically used. However, a pulsed laser capable of emitting a laser beam with an oscillation frequency of 10 megahertiz (MHz) or more (which is far higher than the typical oscillation frequency) and a pulse width on the order of picoseconds ($10^{-12}$ seconds) or on the order of femtoseconds ($10^{-15}$ seconds) may also be used.

A cross-sectional shape of the laser light L may be circular, ellipsoidal, rectangular or linear (specifically, shaped like a relatively long and thin rectangle).

The energy of the laser light L may be high enough to cause emission of gas from the light-absorbing layer patterns 121 or evaporation of the light-absorbing layer patterns 121.

As shown in FIG. 6, the laser light L transmits through the base substrate 110 and is absorbed by the light-absorbing layer patterns 121. Then, portions of the light-absorbing layer patterns 121 at which the laser light L arrives are laser-ablated, and the light-absorbing layer patterns 121 and portions 153 of the reflective material layer 150 (see FIG. 5) which are disposed on the light-absorbing layer patterns 121 are removed together. Accordingly, portions of the reflective material layer 150 (see FIG. 5) which remain on the base substrate 110 form reflective patterns 151. With laser ablation, the laser irradiated portions of the light-absorbing layer patterns 121 are evaporated by the energy of the laser light L absorbed by the light-absorbing layer patterns 121, and the light-absorbing layer patterns 121 and the portions 153 of the reflective material layer 150 (see FIG. 5) which are disposed on the light-absorbing layer patterns 121 are removed (or scattered).

There is no restriction of the method of laser irradiation. In one exemplary embodiment, if the reflective material layer 150 (see FIG. 5) does not include a light-absorbing material, the laser light L may be irradiated to the entire second surface of the base substrate 110. When the laser light L may be irradiated to the entire second surface of the base substrate 110, since only the light-absorbing layer patterns 121 absorb the laser light L, only the light-absorbing layer patterns 121 and the portions 153 of the reflective material layer 150 (see FIG. 5) which are disposed on the light-absorbing layer patterns 121 may be removed.

Alternatively, the laser light L may be irradiated in a. state where a. photomask is placed. In one exemplary, if the reflective material layer 150 (see FIG. 5) includes light-absorbing material, a photomask may be placed on a rear surface of the base substrate 110 in order to reduce or effectively prevent damage to the reflective material layer 150 (see FIG. 5) due to laser irradiation, and then the laser light L may be irradiated. In using the photomask, the photomask may include opening regions corresponding to the light-absorbing layer patterns 121 and blocking regions corresponding to the reflective patterns 151 which are to be formed.

Alternatively, laser oscillators may be placed at positions corresponding to the light-absorbing layer patterns 121, and only the light-absorbing layer patterns 121 may be irradiated with the laser light L. That is, there is no restriction on the method of laser irradiation.

Although not shown in the drawings, after or during the irradiation of the laser light L, a gas such as $N_2$ or air may be sprayed onto the second surface of the base substrate 110 irradiated with the laser light L. In addition, the base substrate 110 may be cleaned using a liquid such as water which is a non-reactive material. By spraying a gas onto the base substrate 110 or by cleaning the base substrate 110 with a liquid, it is possible to remove dust, foreign matter, etc. that affect laser ablation.

Since reflective patterns 151 are formed using laser ablation as described above, a photoresist coating process, an exposure process, a development process using a developing solution, and a photoresist stripping process can be omitted from the process of forming the reflective patterns 151. The operation using the laser ablation can reduce or effectively prevent loss of materials such as a photoresist material and a developing solution, and simplify a mask manufacturing process. Furthermore, since the reflective patterns 151 are formed by laser irradiation, even if the base substrate 110 has a relatively large planar area, the reflective patterns 151 can be formed more easily. That is, according to the invention, a large-area mask can be manufactured more easily.

In a conventional photolithography process, an exposure process using a metal mask is performed to etch the reflective material layer 150 (see FIG. 5). To this end, the metal mask should additionally be manufactured according to the reflective patterns 151 that are to be formed. According to the invention, however, the additional process of manufacturing the metal mask can be omitted, thereby improving process efficiency.

Figure 7:
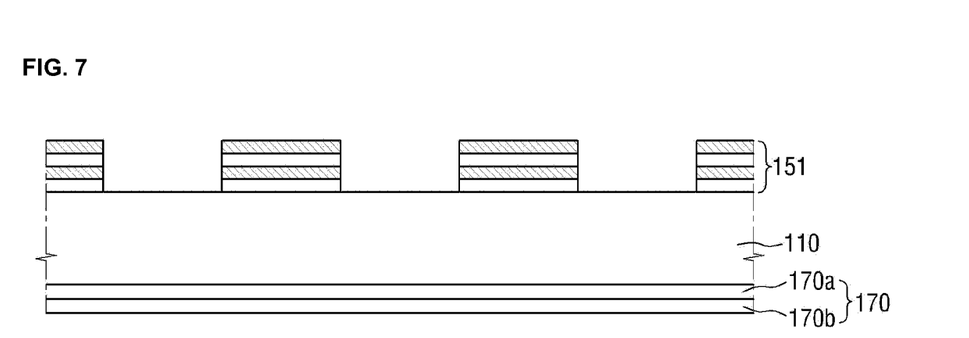

Referring to FIGS. 1 and 7, the method of manufacturing the mask according to the illustrated exemplary embodiment may further include the providing of the reflection preventing layer on the second surface of the base substrate (operation S170).

That is, referring to FIG. 7, a reflection preventing layer 170 may be formed on the entire second surface of the base substrate 110.

The reflection preventing layer 170 allows incident light to transmit therethrough and reduces or effectively prevents incident light from being reflected. The reflection preventing layer 170 may have a single layer structure or may have a multilayer structure including first and second layers 170a and 170b as shown in FIG. 7. When the reflection preventing layer 170 has a multilayer structure, there is no restriction on the number of layers included in the reflection preventing layer 170. In FIG. 7, the reflection preventing layer 170 has a two-layer structure. However, this structure is merely an example.

There is no restriction on the material of the reflection preventing layer 170. In one exemplary embodiment, the reflection preventing layer 170 may include a material that maintains stable optical properties even if exposed to light (e.g., laser light) for a long time and/or a dielectric material such as any one material or a compound of two or more materials selected from $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, VOX, SiNX, eNX, MN, ZnS, CdS, SiC, SiCN, MgF, $CaF_2$, NaF, $BaF_2$, $PbF_2$, LiF, $LaF_3$, and GaP. However, the material of the reflection preventing layer 170 is not limited to the above example materials. The reflection preventing layer 170 may be formed using any of a number of methods that have been developed and commercialized or are realizable depending on future technological developments, such as a spin coating method, a spray coating method, a screen printing method, an inkjet method, a dispensing method, a sputtering method, a PVD method, a CVD method, a PECVD method, a thermal evaporation method, a thermal IBAD method, and an ALD method.

In the reflection preventing layer 170 having a multilayer structure, a low-k layer and a high-k layer may be stacked alternately so as to reduce or effectively prevent reflection of light. There is no restriction on the stacking order of the high-k layer and the low-k layer, the material of each layer and the cross-sectional thickness of each layer as long as reflection of light can be reduced or effectively prevented.

According to the illustrated exemplary embodiment, the reflection preventing layer 170 is formed on the second surface of the base substrate 110 after the laser ablation process. Therefore, even if the laser light L with high energy is used during the laser ablation process, the probability of damage to the reflection preventing layer 170 due to the laser light L can be reduced or effectively prevented.

Figure 8:
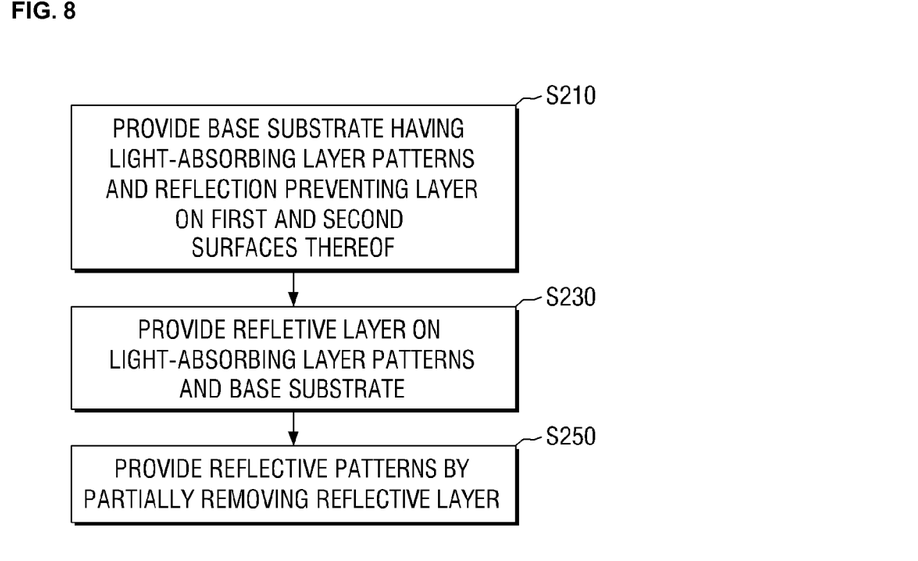
FIG. 8 is a flowchart illustrating another exemplary embodiment a method of manufacturing a mask according to the invention.

FIG. 8 is a flowchart illustrating another exemplary embodiment of a method of manufacturing a mask according to the invention. FIGS. 9 through 12 are cross-sectional views illustrating exemplary embodiments of operations in the manufacturing method of FIG. 8.

Referring to FIG. 8, the method of manufacturing the mask includes providing a base substrate having light-absorbing layer patterns on a first surface thereof and a reflection preventing layer formed on a second surface thereof (operation S210), forming (e.g., providing) a reflective layer on the light-absorbing layer patterns and the base substrate (operation S230), and providing reflective patterns by partially removing the reflective layer (operation S250). Hereinafter, a description of elements and features identical to those described above with reference to FIGS. 1 through 7 will be made briefly or omitted.

Figure 9:
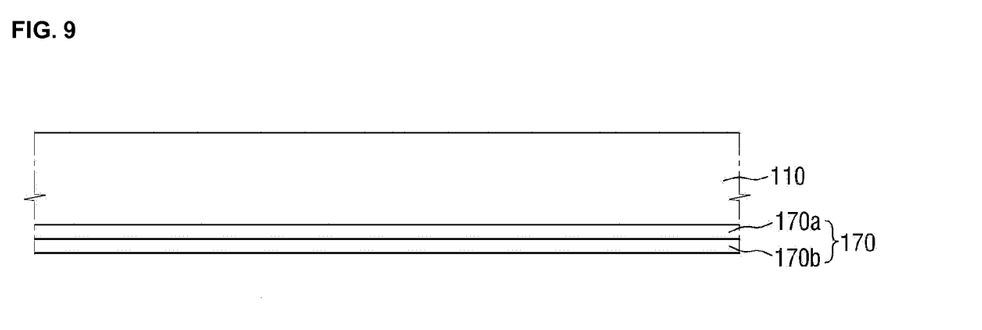
FIGS. 9 through 12 are cross-sectional views illustrating exemplary embodiments of operations in the manufacturing method of FIG. 8.
Figure 10:
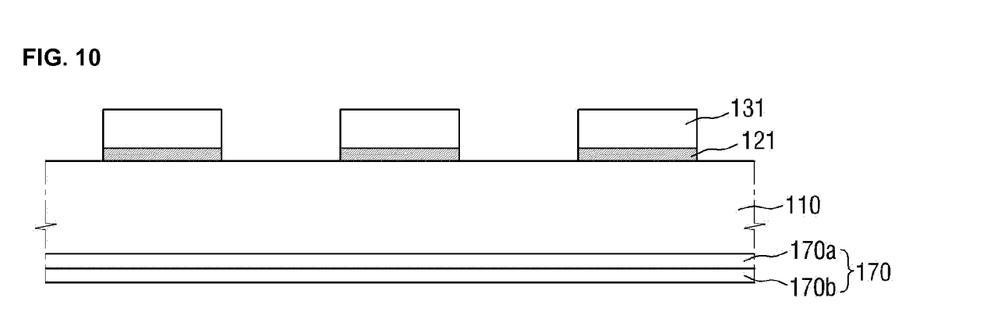

Referring to FIGS. 8 through 10, the providing of the base substrate having the light-absorbing layer patterns on the first surface thereof and the reflection preventing layer provided on the second surface thereof (operation S210) may be performed as follows.

Referring to FIG. 9, a reflection preventing layer 170 is formed on a second surface of a base substrate 110. The reflection preventing layer 170 reduces or effectively prevents reflection of external light. The reflection preventing layer 170 may have a single layer structure or have a multilayer structure including first and second layers 170a and 170b as shown in FIG. 9. Other features of the reflection preventing layer 170 are the same as those described above with reference to FIG. 7, and thus a description thereof will be omitted.

Referring to FIG. 10, light-absorbing layer patterns 121 are formed on a first surface of the base substrate 110. The light-absorbing layer patterns 121 may be formed by forming a light-absorbing material layer on the first surface of the base substrate 110, forming photoresist patterns 131 on the light-absorbing layer, and then patterning the light-absorbing material layer using the photoresist patterns 131 as a mask.

In FIGS. 9 and 10, the reflection preventing layer 170 is formed before the light-absorbing layer patterns 121 are formed. However, the order of these operations is merely an example. That is, unlike the illustration in FIGS. 9 and 10, the light-absorbing layer patterns 121 may be formed on the first surface of the base substrate 110, and then the reflection preventing layer 170 may be formed on the second surface of the base substrate 110.

Although not shown in the drawings, the photoresist patterns 131 may, if necessary, be removed before a subsequent process, or the subsequent process may be performed without removing the photoresist patterns 131 as described above with reference to FIG. 3.

Figure 11:
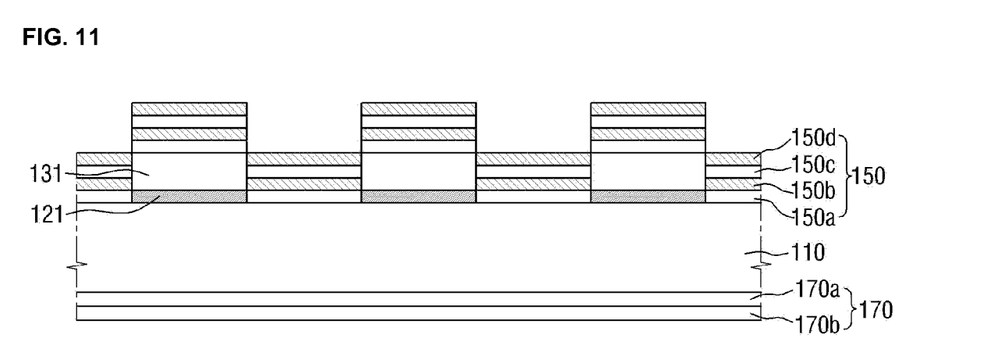

Referring to FIGS. 8 and 11, the providing of the reflective layer on the light-absorbing layer patterns and the base substrate (operation S230) may be performed as follows after the providing of the base substrate having the light-absorbing layer patterns formed on the first surface thereof and the reflection preventing layer formed on the second surface thereof (operation S210).

Referring to FIG. 11, a reflective material layer 150 is formed on the first surface of the base substrate 110 having the light-absorbing layer patterns 121 thereon. That is, the reflective material layer 150 is formed on the first surface of the base substrate 110 exposed between the light-absorbing layer patterns 121 and on the photoresist patterns 131. Although not shown in FIG. 11, if the photoresist patterns 131 have been removed, the reflective material layer 150 may be formed on the first surface of the base substrate 110 exposed between the light-absorbing layer patterns 121 and on the light-absorbing layer patterns 121.

The reflective material layer 150 may be formed to have a multilayer structure, but the structure of the reflective material layer 150 is not limited to the multilayer structure. The method of forming the reflective material layer 150 and the material that forms the reflective material layer 150 are as described above with reference to FIG. 5.

Figure 12:
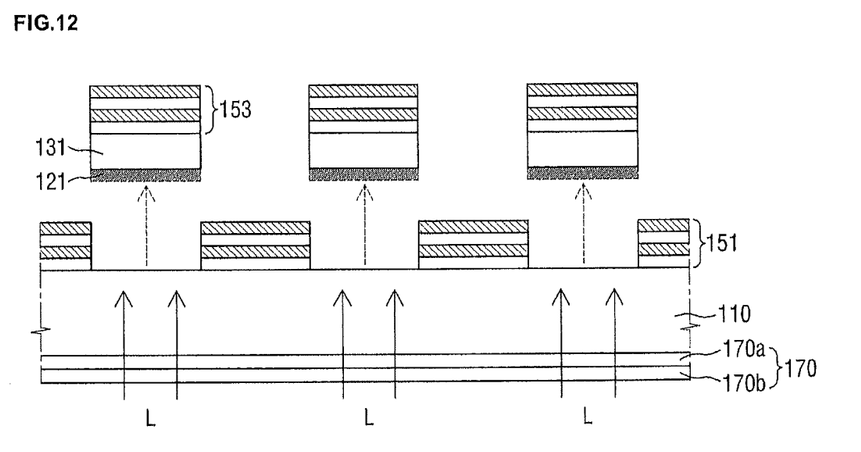

Referring to FIGS. 8 and 12, the forming of the reflective patterns by partially removing the reflective layer (operation S250) may be performed as follows after the forming of the reflective layer on the light-absorbing layer patterns and the base substrate (operation S230).

Referring to FIG. 12, the light-absorbing layer patterns 121 are irradiated with laser light L. Here, a direction in which the laser light L is irradiated may be a direction from the second surface of the base substrate 110 toward the light-absorbing layer patterns 121. The second surface of the base substrate 110 refers to a surface opposite the first surface of the base substrate 110 on which the light-absorbing layer patterns 121 are located.

The laser light L transmits through the reflection preventing layer 170 to reach the base substrate 110, transmits through the base substrate 110 and is absorbed by the light-absorbing layer patterns 121. Then, portions of the light-absorbing layer patterns 121 at which the laser light L arrives are laser-ablated, and the light-absorbing layer patterns 121 and portions 153 of the reflective material layer 150 (see FIG. 5) which are disposed on the light-absorbing layer patterns 121 are removed together. Accordingly, portions of the reflective material layer 150 (see FIG. 5) which remain on the base substrate 110 form reflective patterns 151.

There is no restriction on the laser light L as long as the laser light L has energy absorbed by the light-absorbing layer patterns 121. In particular, the intensity of the laser light L may be adjusted within a range that allows the laser light L to have energy absorbed by the light-absorbing layer patterns 121 and does not substantially affect the reflection preventing layer 170. In addition, a continuous-wave laser beam or a pulsed laser beam may be used as the laser light L. A cross-sectional shape of the laser light L may be circular, ellipsoidal, rectangular or linear (specifically, shaped like a relatively long and thin rectangle). There is no restriction on the method of laser irradiation as described above with reference to FIG. 7.

According to the illustrated exemplary embodiment, since the reflection preventing layer 170 is provided on the base substrate 110 which is formed in advance, the process of forming the reflection preventing layer 170 and other processes can be performed in parallel.

In addition, an additional process of manufacturing a metal mask can be omitted as described above in the embodiment of FIGS. 1 through 7. Thus, process efficiency can be improved. Further, since the reflective patterns 151 are formed by laser irradiation, a relatively large-area mask can be manufactured more easily.

Figure 13:
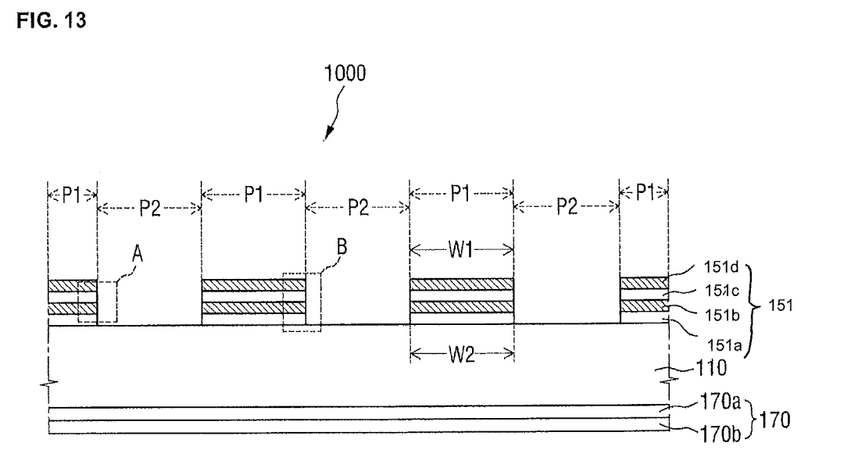
FIG. 13 is a cross-sectional view of an exemplary embodiment of a mask according to the invention.
Figure 14:
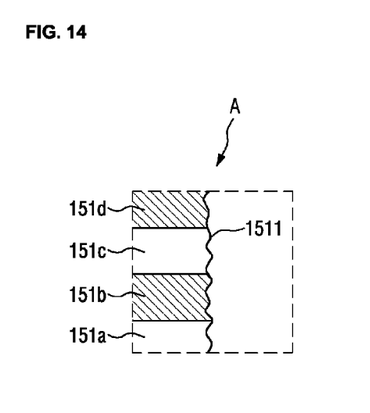
FIGS. 14 and 15 are enlarged cross-sectional views of exemplary embodiments of portions of the mask shown in FIG. 13.
Figure 15:
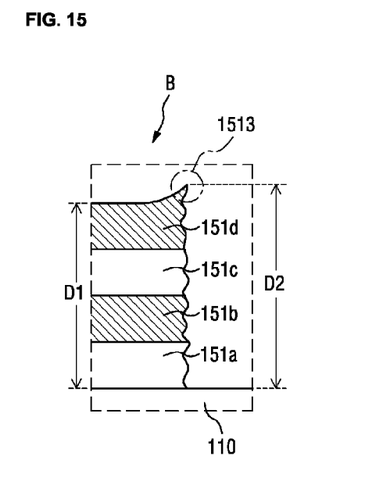

FIG. 13 is a cross-sectional view of an exemplary embodiment of a mask 1000 according to an exemplary embodiment of the invention. FIGS. 14 and 15 are enlarged cross-sectional views of exemplary embodiment of portions of the mask 1000 shown in FIG. 13.

Referring to FIGS. 13 through 15, the mask 1000 includes a base substrate 110, reflective patterns 151 disposed on a first surface of the base substrate 110, and a reflection preventing layer 170 disposed on a second surface of the base substrate 110.

The mask 1000 includes first regions P1 in which the reflective patterns 151 are disposed and second regions P2 which are disposed between the reflective patterns 151 separated from each other. The first regions P1 reflect incident light (e.g., laser light), thus functioning as light-blocking regions in a patterning process. The second regions P2 transmit incident light (e.g., laser light), thus functioning as light-transmitting regions in the patterning process.

The base substrate 110 forms the body of the mask 1000 and supports the reflective patterns 151 and the reflection preventing layer 170. The base substrate 110 may include a light-transmitting material. In one exemplary embodiment, for example, the base substrate 110 may include, but is not limited to, a glass substrate, a quartz substrate, a sapphire substrate, a ceramic substrate, a semiconductor substrate, etc., as described above with reference to FIG. 2.

The reflective patterns 151 reflect incident light (e.g., laser light). The reflective patterns 151 may have a multilayer structure. In one exemplary embodiment, each of the reflective patterns 151 may have a structure in which first reflective film patterns 151a and 151c and second reflective film patterns 151b and 151d may be stacked alternately. The first reflective film patterns 151a and 151c and the second reflective film patterns 151b and 151d are substantially the same as the first reflective films 150a and 150c (see FIG. 5) and the second reflective films 150b and 150d (see FIG. 5) described above with reference to FIG. 5, and thus a detailed description thereof will be omitted.

The reflection preventing layer 170 transmits incident light (e.g., laser light) and reduces or effectively prevents reflection of the incident light. The reflection preventing layer 170 may have a single layer structure or have a multilayer structure including layers 170a and 170b as shown in FIG. 13. The reflection preventing layer 170 may include a material that maintains stable optical properties even if exposed to light (e.g., laser light) for a relatively long time.

FIG. 14 is an enlarged view of an exemplary embodiment of a portion 'A' of a reflective pattern 151 shown in FIG. 13, more specifically, a. side surface of the reflective pattern 151. Referring to FIGS. 13 and 14, the reflective patterns 151 of the mask 1000 according to the illustrated exemplary embodiment are formed by forming a reflective material layer as a single piece and then partially removing the reflective material layer using a laser ablation method, as described above with reference to FIGS. 1 through 12. That is, the reflective patterns 151 are provided by physically removing a portion of the reflective material layer without an etching process. Therefore, as shown in FIG. 14, side surfaces of the reflective patterns 151 may become uneven (as indicated by reference numeral 1511) in the process of partially removing the reflective layer.

FIG. 15 is an enlarged view of an exemplary embodiment of a portion 'B' of a reflective pattern 151 shown in FIG. 13, more specifically, an edge of a top surface of the reflective pattern 151. Referring to FIGS. 13 and 15, the reflective patterns 151 of the mask 1000 according to the illustrated exemplar embodiment are formed by forming a reflective material layer as a single piece and then physically removing a portion of the reflective material layer without an etching process. Therefore, an edge of the top of the side surface of each of the reflective patterns 151 may be extended further than a remainder of the side surface due to the process of partially removing the reflective material layer.

As a result, a protrusion 1513 may be formed on the edge of the top of the side surface of each of the reflective patterns 151. That is, a height D2 from the first surface of the base substrate 110 to the edge (e.g., the protrusion 1513) of the top surface of each of the reflective patterns 151 may be greater than a height D1 from the first surface of the base substrate 110 to the top surface of each of the reflective patterns 151 excluding the protruded edge. In other words, the height of each of the reflective patterns 151 may have a maximum value at the protruded edge (e.g., the protrusion 1513) of the top surface thereof.

Further, referring to FIG. 13, since the reflective patterns 151 are formed by forming a reflective material layer as a single piece and then physically removing part of the reflective material layer without an etching process, a width W1 of a topmost portion of each of the reflective patterns 151 may be different from a width W2 of a bottommost portion thereof In one exemplary embodiment, for example, the width W1 of the topmost portion of each of the reflective patterns 151 may be greater or smaller than the width W2 of the bottommost portion thereof.

That is, since the reflective patterns 151 of the exemplary embodiment of the mask 1000 according to the invention are formed by partially removing a reflective material layer using a laser ablation method, the mask 1000 according to the invention is structurally different from other masks having reflective patterns formed using a conventional lithography method.

One or more exemplary embodiment of the invention provides at least one of the following advantages.

Since reflective patterns are formed by laser ablation, a method of manufacturing a mask in a simplified process and with improved process efficiency can be provided.

In addition, the invention provides a mask manufactured with improved efficiency.

However, the effects of the invention are not restricted to the ones set forth herein. The above and other effects of the invention will become more apparent to one of daily skill in the art to which the invention pertains by referencing the claims.

While the invention has been particularly shown and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A method of manufacturing a mask, the method comprising:
   providing a base substrate comprising light-absorbing layer patterns on a first surface thereof, side surfaces of the light absorbing layer patterns exposing a portion of the first surface of the base substrate;
   providing a reflective layer overlapping the light-absorbing layer patterns and overlapping the exposed portion of the first surface of the base substrate, to dispose the light-absorbing patterns between the reflective layer and the first surface of the base substrate and to dispose the reflective layer overlapping the exposed portion of the first surface of the base substrate facing the side surfaces of the light-absorbing patterns exposing the portion of the first surface of the base substrate; and
   providing reflective patterns by partially removing the reflective layer,
   wherein the providing the reflective patterns comprises removing the light-absorbing layer patterns disposed between the reflective layer and the first surface of the base substrate and a portion of the reflective layer disposed overlapping the light-absorbing layer patterns disposed between the reflective layer and the first surface of the base substrate, by irradiating the light-absorbing layer patterns disposed between the reflective layer and the first surface of the base substrate through a second surface opposite to the first surface of the base substrate with laser light.

2. The method of claim 1, wherein the providing the light-absorbing layer patterns comprises:
   providing a light-absorbing layer on the first surface of the base substrate;
   providing photoresist patterns on the light-absorbing layer; and
   patterning the light-absorbing layer by using the photoresist patterns as a mask.

3. The method of claim 2, wherein the providing the light-absorbing layer patterns further comprises removing the photoresist patterns after the patterning the light-absorbing layer.

4. The method of claim 2, wherein the light-absorbing layer comprises a metallic material or an insulating material.

5. The method of claim 1, wherein the providing the reflective layer comprises alternating a first reflective film and a second reflective film, overlapping the light-absorbing layer patterns disposed between the reflective layer and the first surface of the base substrate and overlapping the exposed portion of the first surface of the base substrate.

6. The method of claim 5, wherein
   one of the first reflective film and the second reflective film comprises a high dielectric constant material, and
   the other one of the first reflective film and the second reflective film comprises a low dielectric constant material.

7. The method of claim 1, further comprising providing a reflection preventing layer on the second surface opposite to the first surface of the base substrate.

8. The method of claim 7, wherein the providing the reflection preventing layer is performed after the providing the reflective patterns.

9. The method of claim 7, wherein the reflection preventing layer has a multilayer structure.

10. A method of manufacturing a mask, the method comprising:
    providing a base substrate comprising light-absorbing layer patterns on a first surface thereof and a reflection preventing layer on a second surface opposite to the first surface thereof, side surfaces of the light absorbing layer patterns exposing a portion of the first surface of the base substrate;
    providing a reflective layer overlapping the light-absorbing layer patterns and overlapping the exposed portion of the first surface of the base substrate, to dispose the light-absorbing patterns between the reflective layer and the first surface of the base substrate and to dispose the reflective layer overlapping the exposed portion of the first surface of the base substrate facing the side surfaces of the light-absorbing patterns exposing the portion of the first surface of the base substrate; and
    providing reflective patterns by partially removing the reflective layer,
    wherein the providing the reflective patterns comprises removing the light-absorbing layer patterns disposed between the reflective layer and the first surface of the base substrate and a portion of the reflective layer disposed overlapping the light-absorbing layer patterns disposed between the reflective layer and the first surface of the base substrate, by irradiating the light-absorbing layer patterns disposed between the reflective layer and the first surface of the base substrate through the second surface opposite to the first surface of the base substrate with laser light.

11. The method of claim 10, wherein the providing the light-absorbing layer patterns comprises:
    providing a light-absorbing layer on the first surface of the base substrate;
    providing photoresist patterns on the light-absorbing layer; and
    patterning the light-absorbing layer by using the photoresist patterns as a mask.

12. The method of claim 11, wherein the providing the light-absorbing layer patterns further comprises removing the photoresist patterns after the patterning the light-absorbing layer.

13. The method of claim 11, wherein the light-absorbing layer comprises a metallic material or an insulating material.

14. The method of claim 10, wherein the providing the reflective layer comprises alternating a first reflective film and a second reflective film, overlapping the light-absorbing layer patterns disposed between the reflective layer and the first surface of the base substrate and overlapping the exposed portion of the first surface of the base substrate.

15. The method of claim 14, wherein one of the first reflective film and the second reflective film comprises a high dielectric constant material, and the other one of the first reflective film and the second reflective film comprises a low dielectric constant material.

16. The method of claim 10, wherein the reflection preventing layer has a multilayer structure.

17. A mask comprising:

reflective patterns on a first surface of a base substrate; and a reflection preventing layer covering a second surface opposite to the first surface, of the base substrate, wherein a side surface of the reflective patterns is uneven.

18. The mask of claim 17, wherein a height from the first surface of the base substrate to a top surface of each of the reflective patterns has a maximum value at an edge of a top of the side surface of each of the reflective patterns.

19. The mask of claim 17, wherein each of the reflective patterns comprises: a first reflective film pattern and a second reflective film pattern alternating with each other, and one of the first reflective film pattern and the second reflective film pattern comprises a high dielectric constant material, and the other one of the first reflective film pattern and the second reflective film pattern comprises a low dielectric constant material.

20. The mask of claim 17, wherein the reflection preventing layer has a multilayer structure.

* * * * *